United States Patent [19]

Trobough et al.

[11] Patent Number: 4,993,958

[45] Date of Patent: Feb. 19, 1991

[54] HIGH DENSITY PLANAR INTERCONNECT

[75] Inventors: Douglas W. Trobough; Mark B. Trobough, both of Beaverton, Oreg.

[73] Assignee: Tektronix, Inc., Beaverton, Oreg.

[21] Appl. No.: 527,396

[22] Filed: May 23, 1990

[51] Int. Cl.⁵ .......................................... H01R 13/00
[52] U.S. Cl. ....................................................... 439/91
[58] Field of Search .............................. 439/86, 88–91, 439/492–499

[56] References Cited

U.S. PATENT DOCUMENTS

| | | | |
|---|---|---|---|
| 3,541,222 | 11/1970 | Parks et al. | 439/91 |
| 3,562,279 | 2/1971 | Bragg, Jr. | 339/17 |
| 4,008,300 | 2/1977 | Ponn | 439/91 |
| 4,227,767 | 10/1980 | Mouissie | 339/176 |
| 4,330,165 | 5/1982 | Sado | 339/59 |
| 4,402,562 | 9/1983 | Sado | 339/61 |
| 4,520,562 | 6/1985 | Sado et al. | 29/878 |
| 4,575,166 | 3/1986 | Kasdagly et al. | 339/17 |
| 4,583,800 | 4/1986 | Roberts et al. | 339/17 |
| 4,636,018 | 1/1987 | Stillie | 339/17 |
| 4,731,693 | 3/1988 | Berg et al. | 361/386 |
| 4,741,101 | 5/1988 | Berg et al. | 29/848 |
| 4,789,765 | 12/1988 | Berg | 200/245 |
| 4,832,609 | 5/1989 | Chung | 439/67 |

OTHER PUBLICATIONS

"High Temperature and Low Compression Set Silicon Rubber Compound" SE 4404U, Product Data, General Electric Silicone Rubber.

Primary Examiner—Joseph H. McGlynn
Attorney, Agent, or Firm—John D. Winkelman; Boulden G. Griffith

[57] ABSTRACT

A deformable connector provides a concentrated wiping action pressure during the connection process, yet forms a flat mating surface when it is fully mated, and that is also suitable for providing a double density connection between a printed circuit board and a flexible circuit cable, as well as other applications. The connector includes an elastomeric member whose lower surface has a first convex region at one end, a second convex region at the other end, and a concave region in a middle joining the first and second convex regions. The upper surface contains a convex region in its middle that is approximately parallel to the concave region of the lower surface, producing an approximately constant thickness over most of the length of the elastomeric member, thus forming a flat mating surface in its fully mated condition. Conductive runs to be connected to a mating surface are disposed on the lower surface of a flexible circuit or cable affixed to the lower surface of the elastomeric member. A frame member and fastening means apply downward pressure to the convex region of the upper surface of the elastomeric member and thereby cause the first and second regions of the lower surface of the elastomeric member to move outwardly, creating a wiping contact between the plurality of conductive runs and the mating surface. In a preferred embodiment, the ends of the upper surface of the elastomeric member converge toward the outer ends of the lower surface to produce tapered ends for strain relief.

22 Claims, 6 Drawing Sheets

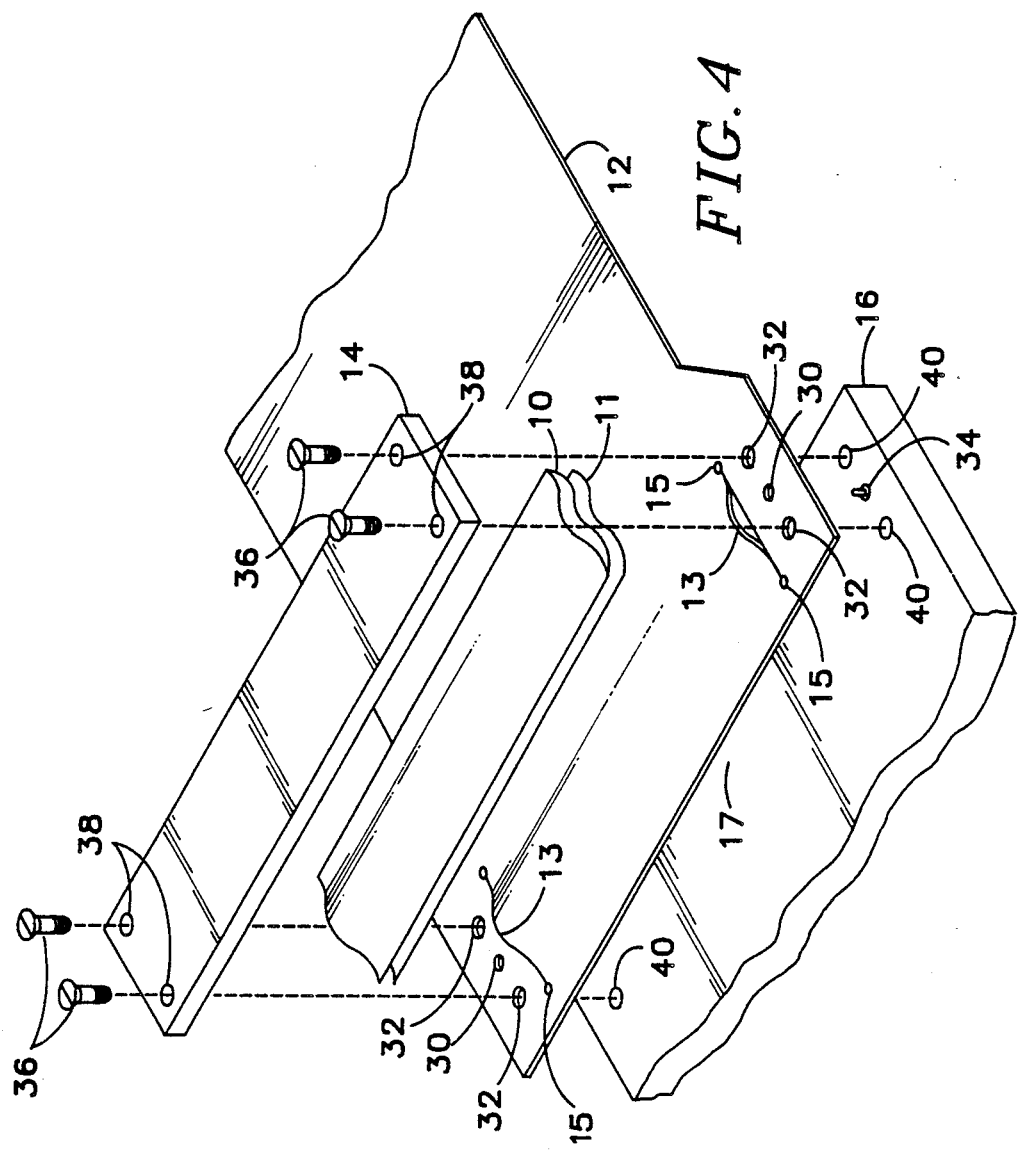

HIGH DENSITY PLANAR INTERCONNECT

BACKGROUND OF THE INVENTION

This invention relates to the field of electrical connectors, and more particularly to the field of high density connectors that are deformable and that produce a wiping action between conductors as mating occurs.

U.S. Pat. No. 4,575,166, to Kasdagly et al., discloses a connector that deforms under the pressure of connection to provide a wiping action between its own electrical conductors and those of the two printed circuit cards that it serves to electrically connect. This wiping action and how it is created are described at column 4, lines 10-38, of the '166 patent and shown in (prior art) FIGS. 1A and 1B of the present patent application.

A limitation of connector shown in the Kasdagly '166 patent, and FIGS. 1A and 1B of this patent application, is that the downward pressure of the hard member is distributed evenly over a relatively large area of the soft member during the connection process, producing a correspondingly limited wiping force to the conductor-conductor interface.

Another limitation of the connector shown in the Kasdagly '166 patent is that it is suitable for creating a connection between two printed circuit boards, but it is not suitable for providing a connection between the runs on both sides of a flexible circuit cable and two rows of conductors on a mating surface of another substrate, i.e., a double density connection.

The use of flexible circuit cables has increased steadily in recent years, and consequently so has the need for means of connecting them to conventional electronic circuit boards.

U.S. Pat. 4,789,765, to Berg, discloses a contact device having a resiliently deformable member with a convex-concave-convex geometry on its mating surface, but with an opposite surface that is flat. This geometry prevents flat mating because of its uneven thickness.

What is desired is a deformable connector that provides a concentrated wiping action pressure as it is connected, yet forms a flat mating surface when it is fully mated, and that is also suitable for providing a double density connection between a printed circuit board and a flexible cable, as well as other applications.

SUMMARY OF THE INVENTION

Accordingly, the present invention is a deformable connector that provides a concentrated wiping action pressure during the connection process, yet forms a flat mating surface when it is fully mated, and that is also suitable for providing a double density connection between a printed circuit board and a flexible circuit cable, as well as other applications.

This connector includes an elastomeric member whose lower surface has a first convex region at one end, a second convex region at the other end, and a concave region in a middle joining the first and second convex regions. The upper surface contains a convex region in its middle that is approximately parallel to the concave region of the lower surface, producing an approximately constant thickness over most of the length of the elastomeric member, thus forming a flat mating surface in its fully mated condition.

A plurality of conductive runs to be connected to a mating surface, are disposed on the lower surface of a flexible circuit affixed to the lower surface of the elastomeric member. A flat frame member and associated fastening means apply downward pressure to the convex region of the upper surface of the elastomeric member and thereby cause the first and second regions of the lower surface of the elastomeric member to move outwardly, creating a wiping contact between the plurality of conductive runs and the mating surface.

In a preferred embodiment, the ends of the upper surface of the elastomeric member converge toward the outer ends of the lower surface to produce tapered ends of the elastomeric member that are particularly well suited for strain relief.

It is an object of the present invention to provide a concentrated wiping action during the mating of this connector to provide a more effective electrical connection. Accordingly, it is a feature of the present invention that the shape of the elastomeric member initially concentrates the applied mating force into two relatively small regions that wiped across the surface to be mated with. Thus, it is an advantage of the present invention that the concentrated mating force applied to the relatively small regions create a wiping action that provides a more effective connection.

It is an object of the present invention to permit high density conductive runs to be effectively connected with a minimum of registration difficulties. Accordingly, it is a feature of the present invention that all of the critical dimensions are built into the flexible circuit which is fabricated by a photo-lithographic process that permits very accurate tolerances to be attained. Thus, it is an advantage of the present invention that high density conductive runs can be effectively connected without registration problems.

It is an object of the present invention to allow the same connector to connect signals from both sides of the flexible circuit cable to one mating surface. Accordingly, it is a feature of the present invention that two independent regions of wiping contact are provided. Thus, it is an advantage of the present invention that one of these two independent regions of wiping contact may be used for signals from one side of the flexible circuit, while the other region of wiping contact is used for signals from the other side of the flexible circuit.

It is an object of the present invention to maintain a satisfactory electrical connection even when part of the normal mating force is relaxed. Accordingly, it is a feature of the present invention that the convex, concave, convex shape of its lower surface maintains contact over two independent regions when part of the normal mating force is relaxed. Thus, it is an advantage of the present invention that satisfactory electrical connection is maintained in these two independent regions even when part of the normal mating force is relaxed.

It is an object of the present invention that the connector provide strain relief for the flexible circuit cable. Accordingly, it is a feature of the present invention that the upper and lower surfaces of the elastomeric member taper toward a point near each end. Thus, it is an advantage of the present invention that the tapered ends of the elastomeric member provide strain relief for the flexible circuit cable by distributing bending forces along a greater radius than would occur with a more abrupt shape to the ends of the elastomeric member.

BRIEF DESCRIPTION OF THE DRAWINGS

FIG. 4 is an exploded view of a complete connector according to the present invention attached to an electronic circuit board.

DETAILED DESCRIPTION

Figure 1A:
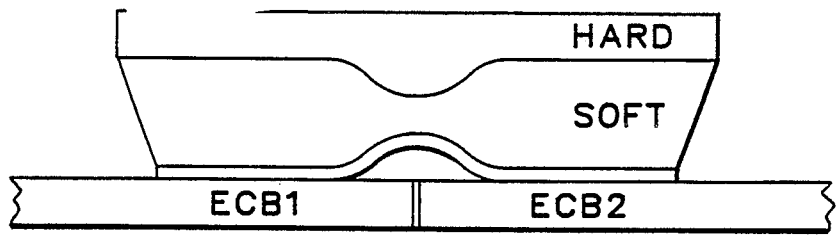
FIGS. 1A and 1B show a deformable connector of the prior art that displays a wiping action as it is deformed by the pressure (mating force) of connection.
Figure 1B:
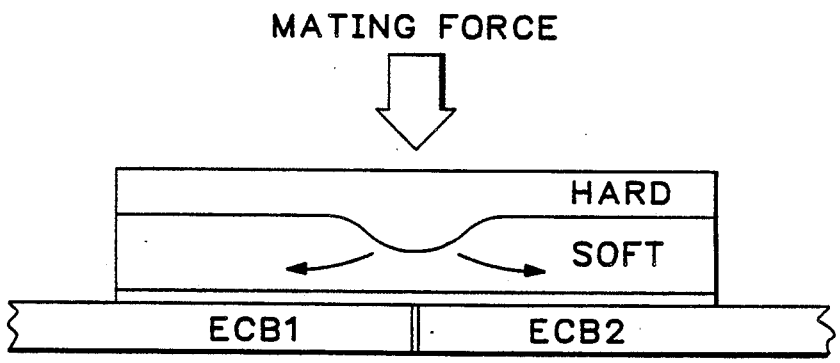

Referring to FIGS. 1A and 1B, in a prior art connector that forms a flat surface when mated as the present invention does. In this connector the mating force applied to the upper layer of hard material compresses the middle layer of soft material so that a bend in a layer of conductors is forced to straighten out, thereby producing a wiping action between those conductors and corresponding conductors on two electronic circuit boards. However, this wiping force is distributed, even initially, over a relatively large area so that the contact force per unit area (contact pressure) is never very high.

Figure 2A:
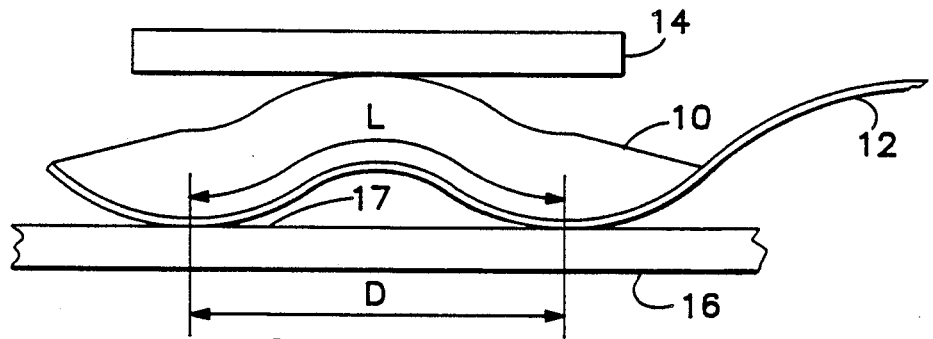
FIGS. 2A and 2B show the deformable elastomeric connector of the present invention, with FIG. 2A illustrating its shape in its relaxed (unmated) condition and FIG. 2B showing it in its mated condition.
Figure 2B:
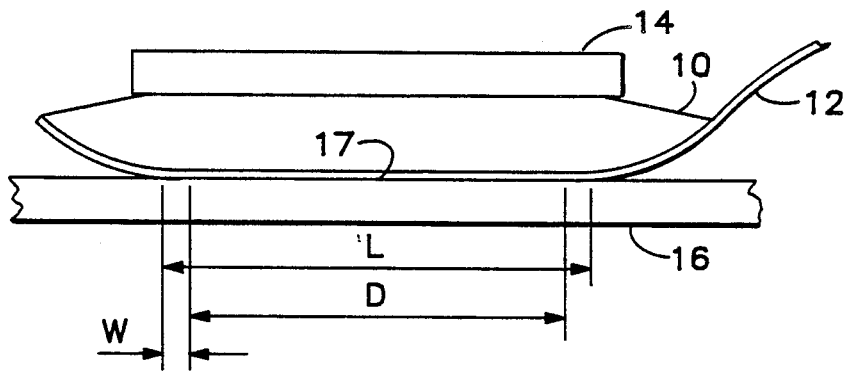

Referring now to FIG. 2A and 2B, in the connector of the present invention, as a downward mating force is applied to the flat frame 14, half of this force is transmitted to each of two small regions (at the ends of the line labeled "D") of contact between the flexible circuit 12 and an upper mating surface of the electronic circuit board 16, thereby concentrating the force into a small area.

As elastomeric member 10 is compressed by the downward mating force being applied to frame 14, these contact points move outwardly, wiping the mating conductors together. This process continues until the curvature along bend L of FIG. 2A is eliminated and the mated connector appears as it is shown in FIG. 2B. A distance of $W=(L-D)/2$ is wiped by each region of maximum contact force as mating occurs. Just before mating occurs, the area of contact increases. However, until that occurs, the concentrated wiping action provides better contact between the two conducting surfaces, thus achieving superior electrical performance.

The term "elastomer" is used throughout this document to mean any polymer with rubber-like properties, i.e., some degree of deformability and a high degree of resilience. The particular elastomer initially used to produce examples of the present invention is a silicone rubber compound, GE SE4404U, cured by a dicumyl peroxide agent. In this type of elastomer, the backbone of the polymer chain consists of silicon and oxygen. General Electric describes SE 4404U as a "50 durometer . . . High Temperature and Low Compression Set Silicone Rubber Compound".

Alternative materials include Styrene Butadiene (SBR), Buna N (NBR), Cloroprene rubber (Neoprene TM), and flouroelastomers, among others. Elastomers are used in this invention for their resiliency, and in particular their compression set resistance. This property is important because a connector must be capable of spending long periods of time under compression while mated and yet be capable of releasing and mating again, possibly many, many times over an operating lifetime.

The magnitude of the wiping force applied to the surface to be mated with can be increased by increasing the stiffness of the elastomeric member 10 or by bonding a thin layer of stiffer material 11 (FIG. 4) to the lower surface of the elastomeric member. The latter approach has additional benefits during the process of constructing this connector, as will be further discussed below. By varying the type of elastomer used and/or the stiffness of the bonded layer of stiffer material 11, the force applied to surface to be mated with may be varied over a very wide range for different applications.

Figure 3:
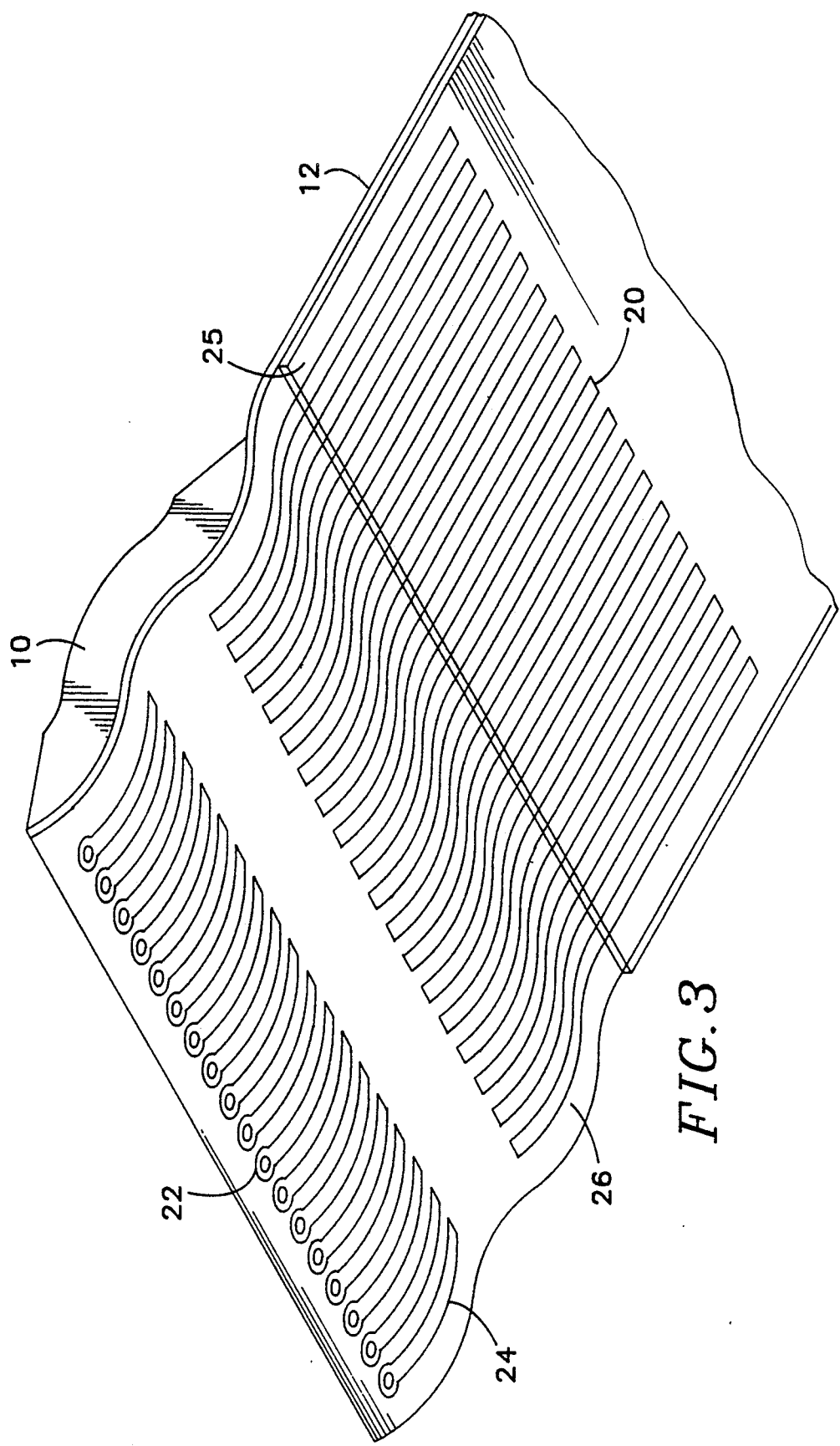
FIG. 3 is a perspective view of the underside of a double-sided flexible circuit affixed to a piece of elastomer shaped according to the present invention.

Referring to FIG. 3, the lower surface of a flexible circuit 12, having a number of conductive runs 20 imbedded within its lower surface, is shown with an elastomeric member 10 shaped according to the present invention affixed to its upper surface. The upper surface (not visible) also has conductive runs imbedded in it. The conductive runs 12 on the upper surface of the elastomeric member 10 are connected by vias 22 to a second set of short conductive runs 24 on the lower surface. The short conductive runs 24 and the region of the conductive runs 20 that are beneath the elastomeric member 10 are both left exposed, rather than being covered by the outer sheets 25 of fluorinated ethylene propylene polymer or polyimide coating that insulate the conductors over most of the length of the cable. Thus, two sets of conductive runs, one from each side of the flexible circuit, may be connected to a mating surface (not shown in this figure) by the connector of the present invention.

The width, length, contact pitch and spacing, number of conductors, and the conductor metallurgy of this connector is determined by the user's application and the processes available for constructing the flexible circuit.

Referring to FIG. 4, a complete connector, flexible circuit cable, and electronic circuit board are shown (except that the conductive runs on both the flexible circuit cable and the surface to be mated with 17 on the electronic circuit board are omitted for simplicity). In the normal course of construction, elastomeric member 10 is first molded or extruded into the shape described above. To facilitate pressure bonding later between the elastomeric member 10 and the flexible circuit cable 12, the lower surface of the elastomeric member 10 may be fitted with a thin layer 11 of polyimide or other suitable material during the molding or extruding process.

Slits 13 are optionally made in the flexible circuit 12 to allow the region of the flexible circuit between these slits to conform itself to the shape of the elastomeric member 10 without distorting the rest of the flexible circuit. Whether or not such slits are necessary is determined by the relative stiffness of the flexible circuit in this region and the elastomeric member 10. If the flexible cable is stiff, it may be necessary to pre-form the flexible cable 12 to the shape of the lower surface of the elastomeric member 10 in the region of the flexible cable where the elastomeric member is to be attached. If such slits 13 are needed, the holes 15 are placed in the flexible circuit 12 during its fabrication to prevent the slits from increasing in length due to tearing stresses during further assembly of the connector or during handling of the flexible circuit in later operation.

Referring still to FIG. 4, registration holes 30 (one adjacent to each slit 13) permit accurate alignment of the flexible circuit to features on the mating surface 17 of electronic circuit board 16. Registration pins 34 on the target electronic circuit board 16 mate with registration holes 30 on the flexible circuit board 16. Screws 36 secure frame 14 to the upper surface of the elastomeric member 10 by screwing into attachment holes 40 in the electronic circuit board 16 through holes 32 in the flexible circuit cable 12, thus maintaining the mating force required by the connector.

Figure 5A:
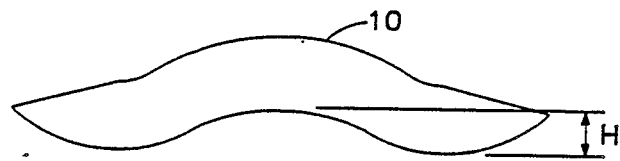
FIGS. 5A and 5B illustrate the ability of a connector according to the present invention to maintain good electrical contact even when the normal mating force is partially relaxed.
Figure 5B:
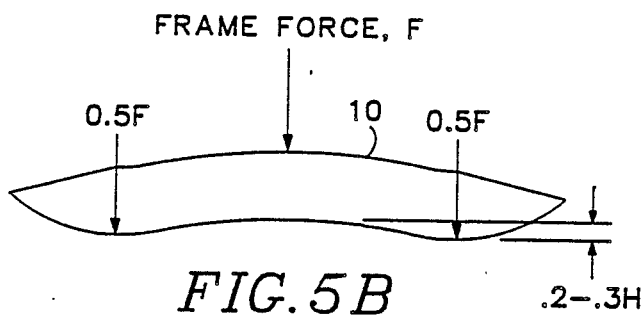

Referring now to FIGS. 5A and 5B, as can be seen in FIG. 5A, the concave region of the lower surface of the elastomeric member 10 is a distance H above the surface to be mated with when the connector is in its relaxed (unmated) condition. When it is fully mated this surface is in contact with the surface to be mated with 17 (FIG. 4). However, as can be seen in FIG. 5B, the design of the present invention causes good electrical contact to be maintained even when the connector is permitted to partially relax from its fully mated position.

Figure 6A:
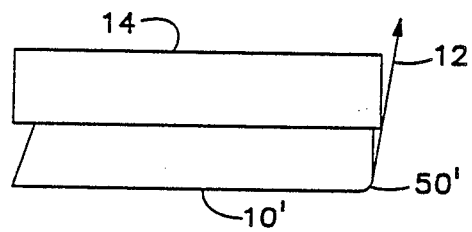
FIGS. 6A and 6B illustrate the strain relief properties of the elastomeric member when it is fabricated according to the preferred embodiment of the invention.
Figure 6B:
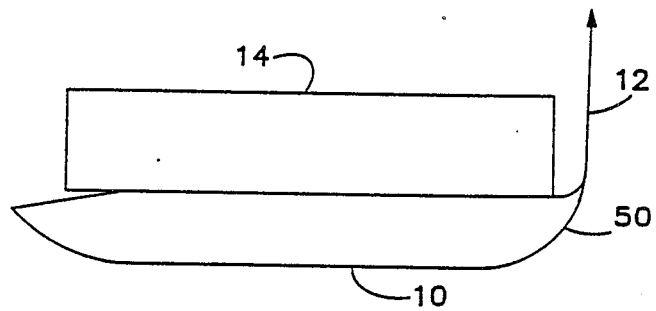

Referring to FIG. 6A, without the tapered regions at the ends of the elastomeric member 10', strong bending forces applied to the flexible circuit cable 12 in the direction of the frame 14 create a crease or sharp bend 50' with a small turning radius. However, when the same strong bending forces are applied to a flexible circuit cable 12 affixed to an elastomeric member 10 having the tapered regions, a much larger turning radius 50 results. Thus, the tapered regions at the ends of the elastomeric member 10 provide excellent strain relief for the flexible circuit cable 12 when it is pulled in the direction of the fastening frame 14. This strain relief also helps to prevent forces pulling in the direction of the frame 14 from lifting that side of the connector out of electrical contact with the surface to be mated with 17 (FIG. 4). Varying degrees of "roundedness" can be substituted for the "point" at the end of the taper, with concomitant bending radii a result.

Figure 7:
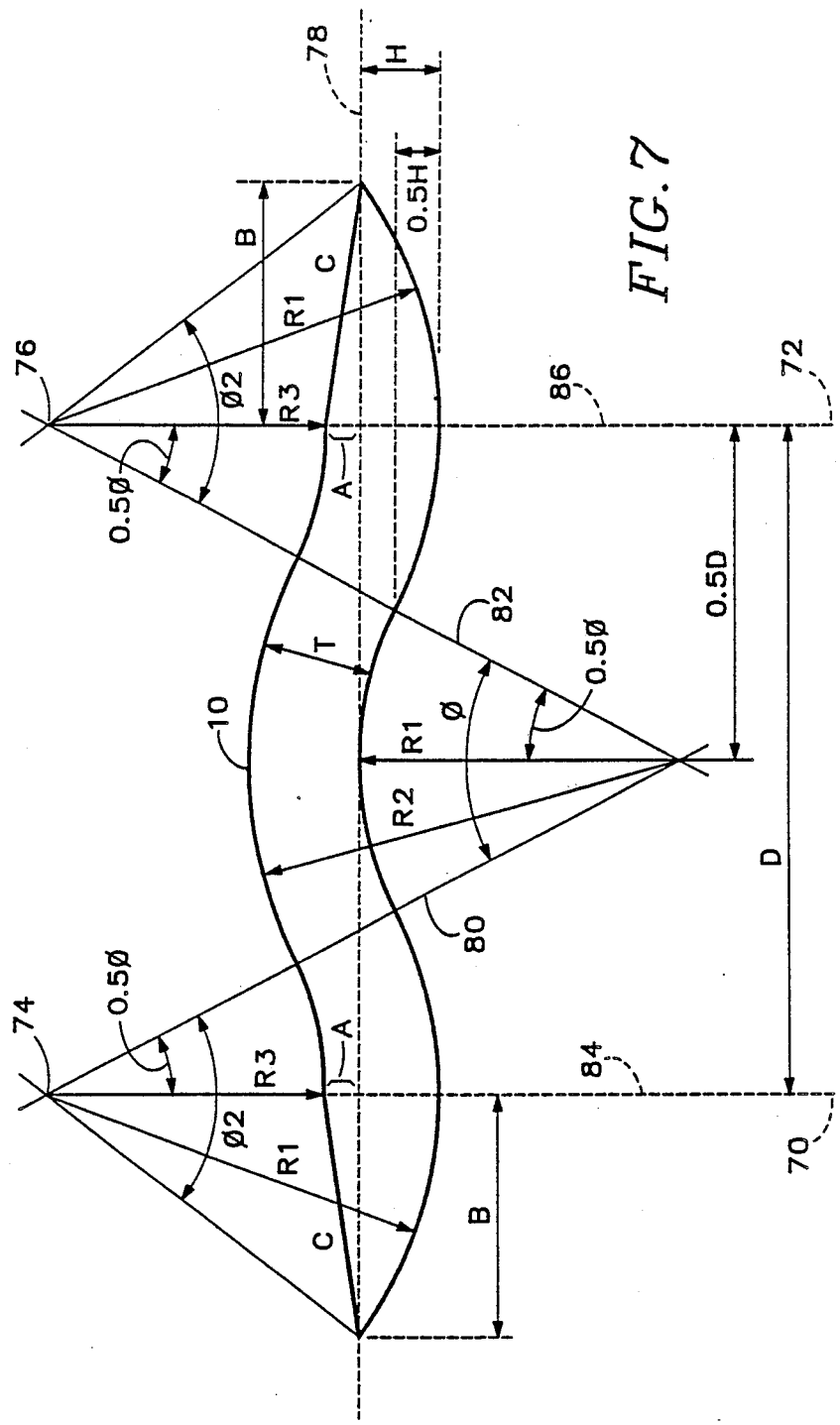
FIG. 7 is a geometric analysis of the desired shape of the elastomeric member according to the present invention.

Referring to FIG. 7, the ideal shape of an elastomeric member 10 according to the present invention is shown for geometric analysis. Starting with the desired length L (FIGS. 2A and 2B) of the connection points in the mated position, and with the desired wiping distance, $W=(L-D)/2$, a suitable elastomeric member 10 can be designed.

The convex and concave portions of the elastomeric member 10 can be described in terms of an angle, Phi, and a radius, R1. The angle Phi and the radius R1 in FIG. 7 are defined by the following relationships:

$$Phi = L/(2R1) \qquad (1)$$

$$R1 = D/[4sin(Phi/2)] \qquad (2)$$

With L and D known, these two simultaneous equations can be solved for unique values of Phi and R1. A thickness T of the elastomeric member 10 must also be defined. The value for T, the thickness, is somewhat arbitrary, but cannot exceed R1, since R3 must be positive and $R3 = R1 - T$. The unmated height H between the center of the concave region of the lower surface of the elastomeric member 10 and the surface to be mated with 17 is the described by equation 3:

$$H = 2*R1*[1 - cos(Phi/2)] \qquad (3)$$

As an example, for a desired final contact separation distance of 0.300 inches and a wiping distance of 0.015 inches for each contact, Phi is 90 degrees, R1 is 0.0955 inches, and H is 0.056 inches.

Note, however, that the above requirements and corresponding results do not specify the thickness of the elastomer T. T is determined by the required contact force, the stiffness of the elastomer (and any stiffening element affixed to it), and the space available. In an embodiment preferred for a particular application, the thickness T has been specified as 0.0750 inches. The thickness T as measured parallel to the critical radii R1, is constant over the central region of the elastomeric member 10.

Referring again to FIG. 7, note that the lower surface of the elastomeric member 10 extends beyond the angle 0.5 Phi swept from the vertical lines 70 and 72 about points 74 and 76. This surface terminates, somewhat arbitrarily, at the point where the lower surface intersects dotted line 78, a horizontal line tangent to the center curve of the lower surface. Measured from the lines 80 and 82, which are perpendicular to the lower surface of the elastomeric member 10 and intersect that surface at its inflection points, the convex regions of the lower surface sweep out angles Phi-2, which in this example are 110.5 degrees.

The intersections between horizontal line 78 and the lower surface are the endpoints of the cross-section of the elastomeric member 10. To create the straight regions of the upper surface, the shape is completed by connecting these points to the intersections between the vertical lines 84 and 86 and the concave regions of the upper surface. For the example described above, lines C connecting these points are 0.089 inches in length, and lines A and B are 0.019 and 0.087 inches in length.

To construct the complete connector according to the present invention, one must first make a flexible circuit cable with alignment holes 38 and the slits 13 (both shown in FIG. 4) that permit the flexible circuit to conform to the shape of the elastomeric member 10. Flexible circuits are typically made of a central substrate of polyimide on which circuitry has been etched in an adhered layer of rolled annealed copper. Very detailed circuit elements and fine lines in accurate registration can be obtained, because the circuit elements are defined by a photo-lithographic process. The circuitry, which can be on both sides of the central substrate, is then covered with sheets of fluorinated ethylene propylene polymer or polyimide coating affixed with acrylic adhesive.

The elastomeric member 10, with its cross-sectional shape according to the present invention, may be molded in the desired length, or extruded and cut to size later. The pressure of the elastomer within the mold forces the sheet of polyimide or other material to conform to the shape of the mold. And, as the elastomer is cured in the mold, the elastomer is chemically bonded to the sheet of stiffener material.

The use of the stiffener 11 depends primarily on two factors: (1) whether or not a pressure sensitive adhesive is to be used, the affixing of the elastomeric member 10 to the flexible circuit cable 12, and (2) the surface energy of the type of elastomer being used to make the elastomeric member 10.

With high surface energy elastomers, such as urethane, that are easy to bond to, the elastomeric member 10 can be bonded directly to the flexible circuit cable 12 with a pressure sensitive adhesive. However, with low surface energy elastomers, such as most silicones and flouroelastomers, that do not bond well with pressure sensitive adhesives, a thin layer of material that does bond well to such adhesives is fabricated into lower surface of the elastomeric member 10 while it is being molded or extruded. The resulting elastomeric member 10 has the same shape as one made without the stiffener 11, but it can now be readily bonded to the flexible circuit cable using a pressure sensitive adhesive. The particular elastomer used to make the elastomeric member 10 should also have a maximum continuous use temperature that is adequate to the environment within which it is to be used.

The elastomeric member 10 is then affixed to the flexible circuit cable 12 with an adhesive. A pressure sensitive adhesive makes this step easy if a stiffening element 11 has been molded into the elastomeric member or the surface of the particular elastomer being used is high in energy and therefore easily bonded to. However, other adhesives might be used and the need for the stiffening element eliminated, if so desired. The elastomeric member 10 is affixed to the region of the flexible circuit cable between the (optional) slits 13. It may be desirable, depending on the relative stiffness of the elastomeric member 10 and the flexible cable 12, to pre-shape the flexible circuit cable to the shape of the lower surface of the elastomeric member.

The flexible circuit cable 12 with elastomeric member 10 affixed to it, can be aligned to the surface to be mated with 17 by various means, including the use of an alignment pin 34, as shown in FIG. 4. For less critical applications, the holes 32 used for the fastening means may provide sufficient registration accuracy, eliminating the need for the alignment holes.

Once the flexible circuit cable 12 with the elastomeric member 10 affixed to it has been aligned to the surface to be mated with, the application of the mating force and the securing of the connection can be accomplished using a variety of fastening means. Some sort of flat surface, such as frame 14, must exert pressure downward over the whole area of the elastomeric member 10. The frame, or equivalent pressure applying means, must then be held in the mated position using some holding means, such as screws, clamps, latches, etc.

While the discussion thus far has focused on flexible circuit cables, the present invention can be usefully used with almost any flat cable, ribbon cables, or even discrete wires, as well as with conductive runs applied directly to the elastomeric member 10 or its stiffening element 11 by any of a number of processes. Furthermore, the same basic idea will also work to connect one printed circuit board to another, to connect a multi-component module to a printed circuit board, or any other "jumper" application.

Figure 8:
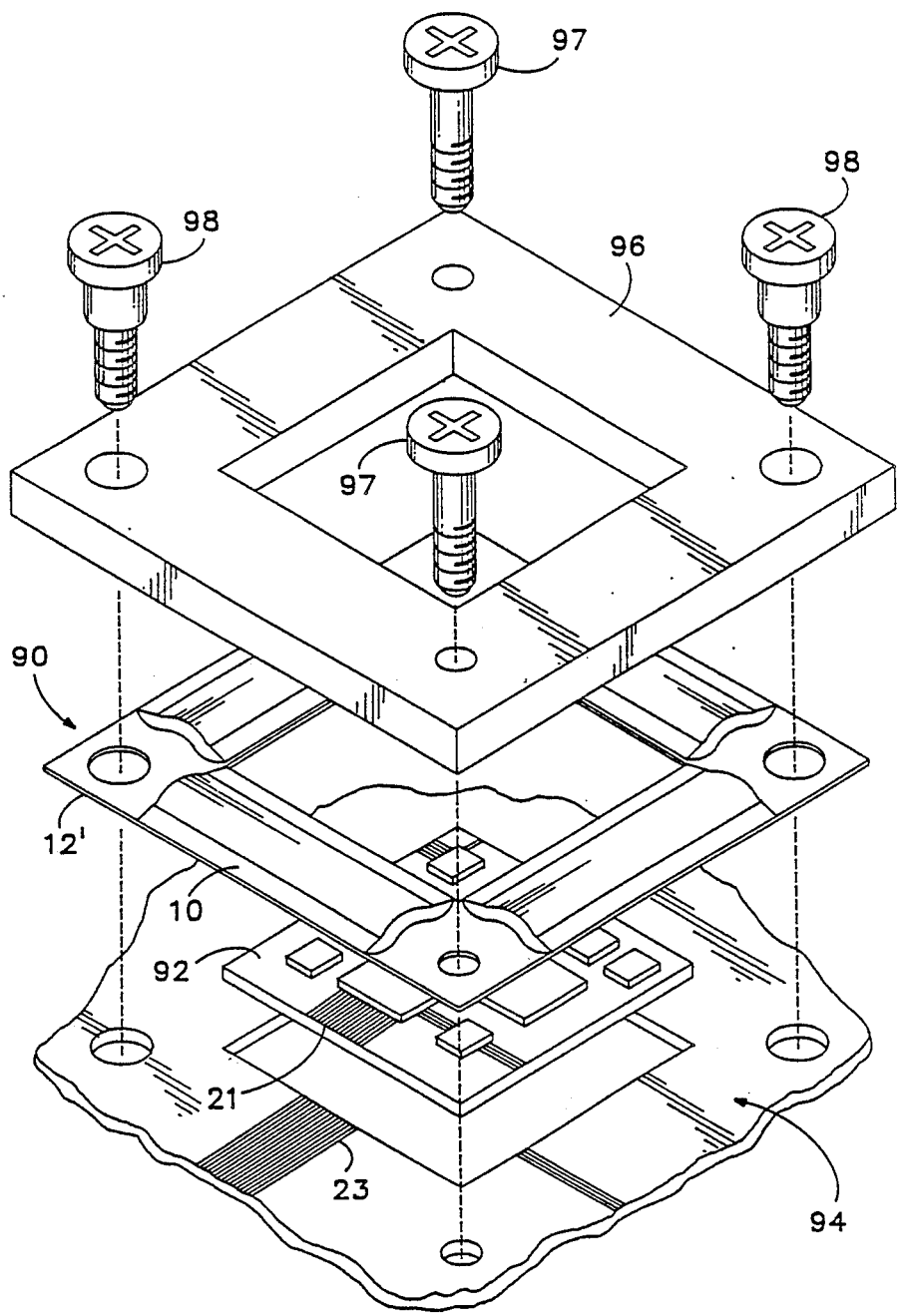
FIG. 8 is an exploded view of a four-sided connector according to the present invention being used to connect a multi-component module to a printed circuit board.

Referring to FIG. 8, a four-sided connector 90 according to the present invention being used to connect a multi-component module 92 to a printed circuit board 94 is shown in an exploded view. Conductive runs (not visible) on the underside of flexible circuit 12' are pressed into contact with the conductive runs 21 on the multi-component module 92 and the conductive runs 23 on the printed circuit board 94 by the pressure applied to the elastomeric members 10 by the four-sided frame 96.

Screws 97 help to secure the frame 96 to the printed circuit board 94. Alignment screws 98 ensure proper alignment, as well as helping to secure the frame 96 to the printed circuit board 94.

While a preferred embodiment of the present invention has been shown and described, it will be apparent to those skilled in the art that many changes and modifications may be made without departing from the invention in its broader aspects. The claims that follow are therefore intended to cover all such changes and modifications as fall within the true spirit and scope of the invention.

We claim:

1. A connector comprising:
   an elastomeric member having a lower surface and an upper surface, the lower surface having a first convex region at one end, a second convex region at the other end, and a concave region in a middle joining the first and second convex regions, and the upper surface having a convex region in the middle so that the upper surface in the convex region of the upper surface is approximately parallel to the concave region of the lower surface, the upper surface also having two end regions opposite the first and second convex regions;
   a conductive run disposed below the lower surface of the elastomeric member; and
   means for applying pressure downward on the upper surface of the elastomeric member to deform the elastomeric member and cause the first and second regions of the lower surface of the elastomeric member to move outwardly, thus creating a wiping contact between the conductive run and a mating surface.

2. A connector as recited in claim 1 wherein the end regions opposite the first and second convex regions are approximately linear and convergent with the first and second convex regions so that the first and second ends of the elastomeric member taper to a point so as to provide improved strain relief.

3. A connector as recited in claim 1 wherein the elastomeric member comprises:
   a stiffening element adhered to the lower surface.

4. A connector as recited in claim 1 wherein the pressure applying means comprises:
   a frame disposed along the upper surface of the elastomeric member for applying downward pressure to the convex region of the upper surface of the elastomeric member; and
   fastening means for pressing the frame against the upper surface of the elastomeric member to deform it and thereby press the cable affixed to the elastomeric member into contact with the mating surface.

5. A connector as recited in claim 1 wherein the conductive run comprises a plurality of conductive runs.

6. A connector as recited in claim 5 wherein the plurality of conductive runs comprise:
   a first group of conductive runs disposed on a portion of the first convex region of the elastomeric member; and a second group of conductive runs disposed on a portion of the second convex region of the elastomeric member.

7. A connector as recited in claim 1 further comprising:
a cable affixed to the lower surface of the elastomeric member.

8. A connector as recited in claim 7 wherein the cable comprises a ribbon cable.

9. A connector as recited in claim 7 wherein the cable comprises a flexible circuit cable.

10. A connector as recited in claim 9 wherein the end regions opposite the first and second convex regions are approximately linear and convergent with the first and second convex regions so that the first and second ends of the elastomeric member taper to a point so as to provide improved strain relief.

11. A connector as recited in claim 9 wherein the elastomeric member comprises:
a stiffening element adhered to the lower surface.

12. A connector as recited in claim 9 wherein the pressure applying means comprises:
a frame disposed along the upper surface of the elastomeric member for applying downward pressure to the convex region of the upper surface of the elastomeric member; and
fastening means for pressing the frame against the upper surface of the elastomeric member to deform it and thereby press the cable affixed to the elastomeric member into contact with the mating surface.

13. A connector as recited in claim 9 wherein the conductive run disposed on the lower surface of the flexible circuit cable comprises a plurality of conductive runs.

14. A connector as recited in claim 13 wherein the plurality of conductive runs disposed on the lower surface of the flexible circuit cable comprise:
a first group of conductive runs disposed on a portion of the flexible circuit cable affixed to the first convex region of the elastomeric member; and
a second group of conductive runs disposed on a portion of the flexible circuit cable affixed to the second convex region of the elastomeric member.

15. A connector as recited in claim 1 further comprising:
a flexible circuit element affixed to the lower surface of the elastomeric member.

16. A connector as recited in claim 15 wherein the end regions opposite the first and second convex regions are approximately linear and convergent with the first and second convex regions so that the first and second ends of the elastomeric member taper to a point so as to provide improved strain relief.

17. A connector as recited in claim 15 wherein the elastomeric member comprises:
a stiffening element adhered to the lower surface.

18. A connector as recited in claim 15 wherein the pressure applying means comprises:
a frame disposed along the upper surface of the elastomeric member for applying downward pressure to the convex region of the upper surface of the elastomeric member; and
fastening means for pressing the frame against the upper surface of the elastomeric member to deform it and thereby press the flexible circuit element affixed to the elastomeric member into contact with the mating surface.

19. A connector as recited in claim 15 wherein the mating surface comprises:
a module; and
an electronic circuit board.

20. A connector as recited in claim 15 wherein the mating surface comprises:
a first electronic circuit board; and
a second electronic circuit board.
a stiffening element adhered to the lower surface.

21. A connection as recited in claim 15 wherein the conductive run disposed on the lower surface of the flexible circuit element comprises a plurality of conductive runs.

22. A connector as recited in claim 21 wherein the plurality of conductive runs disposed on the lower surface of the flexible circuit element comprise:
a first group of conductive runs disposed on a portion of the flexible circuit element affixed to the first convex region of the elastomeric member; and
a second group of conductive runs disposed on a portion of the flexible circuit element affixed to the second convex region of the elastomeric member.

* * * * *

UNITED STATES PATENT AND TRADEMARK OFFICE
CERTIFICATE OF CORRECTION

PATENT NO. : 4,993,958

DATED : February 19, 1991

INVENTOR(S) : Douglas W. Trobough, Mark B. Trobough

It is certified that error appears in the above-identified patent and that said Letters Patent is hereby corrected as shown below:

Col. 10, line 33, "a stiffening element adhered to the lower surface." should be deleted.

Col. 10, line 34, "connection" should be "connector".

Signed and Sealed this

Fourteenth Day of July, 1992

Attest:

DOUGLAS B. COMER

*Attesting Officer*     *Acting Commissioner of Patents and Trademarks*